(12) United States Patent
Inoue et al.

(10) Patent No.: US 11,145,485 B2
(45) Date of Patent: Oct. 12, 2021

(54) MULTIPLE ELECTRON BEAMS IRRADIATION APPARATUS

(71) Applicants: NuFlare Technology, Inc., Kanagawa (JP); NuFlare Technology America, Inc., Sunnyvale, CA (US)

(72) Inventors: Kazuhiko Inoue, Yokohama (JP); Atsushi Ando, Edogawa-ku (JP); Munehiro Ogasawara, Hiratsuka (JP); John Hartley, Stormville, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 16/726,003

(22) Filed: Dec. 23, 2019

(65) Prior Publication Data
US 2020/0211812 A1  Jul. 2, 2020

Related U.S. Application Data

(60) Provisional application No. 62/785,014, filed on Dec. 26, 2018.

(51) Int. Cl.
*H01J 37/15* (2006.01)
*H01J 37/12* (2006.01)
(Continued)

(52) U.S. Cl.
CPC ......... *H01J 37/153* (2013.01); *H01J 37/12* (2013.01); *H01J 37/3177* (2013.01); *H01J 2237/0437* (2013.01); *H01J 2237/1534* (2013.01)

(58) Field of Classification Search
CPC .......... H01J 37/3177; H01J 2237/0437; H01J 2237/0435; H01J 37/153; H01J 37/12
See application file for complete search history.

(56) References Cited

U.S. PATENT DOCUMENTS

| | | | | | |
|---|---|---|---|---|---|
| 5,834,783 | A | * | 11/1998 | Muraki | B82Y 10/00 250/398 |
| 6,014,200 | A | * | 1/2000 | Sogard | B82Y 10/00 250/492.3 |

(Continued)

FOREIGN PATENT DOCUMENTS

JP  2014-229481  12/2014

*Primary Examiner* — Sean M Luck
(74) *Attorney, Agent, or Firm* — Oblon, McClelland, Maier & Neustadt, L.L.P.

(57) ABSTRACT

A multiple electron beam irradiation apparatus includes a shaping aperture array substrate to form multiple primary electron beams, a plurality of electrode array substrates stacked each to dispose thereon a plurality of electrodes each arranged at a passage position of each of the multiple primary electron beams, each of the multiple primary electron beams surrounded by an electrode of the plurality of electrodes when each of the multiple primary electron beams passes through the passage position, the first wiring and the second wiring applied with one of different electric potentials, and a stage to mount thereon a target object to be irradiated with the multiple primary electron beams having passed through the plurality of electrode array substrates, wherein, in each of the plurality of electrode array substrates, each of the plurality of electrodes is electrically connected to either one of the first wiring and the second wiring.

7 Claims, 10 Drawing Sheets

(51) Int. Cl.
 *H01J 37/153* (2006.01)
 *H01J 37/317* (2006.01)

(56) References Cited

U.S. PATENT DOCUMENTS

| | | | | |
|---|---|---|---|---|
| 6,313,023 B1* | 11/2001 | Maruyama | | H01J 9/14 |
| | | | | 438/20 |
| 6,566,664 B2* | 5/2003 | Muraki | | B82Y 10/00 |
| | | | | 250/492.2 |
| 6,617,595 B1* | 9/2003 | Okunuki | | G21K 1/08 |
| | | | | 250/398 |
| 6,777,697 B2* | 8/2004 | Yui | | B82Y 10/00 |
| | | | | 250/492.22 |
| 6,787,780 B2* | 9/2004 | Hamaguchi | | B82Y 10/00 |
| | | | | 250/396 ML |
| 6,872,950 B2* | 3/2005 | Shimada | | B82Y 10/00 |
| | | | | 250/396 R |
| 6,872,951 B2* | 3/2005 | Yagi | | B82Y 10/00 |
| | | | | 250/396 R |
| 6,872,952 B2* | 3/2005 | Shimada | | G21K 1/087 |
| | | | | 250/396 R |
| 6,903,352 B2* | 6/2005 | Muraki | | B82Y 10/00 |
| | | | | 250/398 |
| 6,903,353 B2* | 6/2005 | Muraki | | B82Y 10/00 |
| | | | | 250/396 R |
| 6,965,153 B1* | 11/2005 | Ono | | H01J 9/14 |
| | | | | 250/491.1 |
| 7,301,263 B2* | 11/2007 | Maldonado | | H01J 37/073 |
| | | | | 313/103 CM |
| 7,378,671 B2* | 5/2008 | Muraki | | B82Y 10/00 |
| | | | | 250/492.22 |
| 8,878,143 B2* | 11/2014 | Yasuda | | H01J 37/147 |
| | | | | 250/396 R |
| 9,224,576 B2* | 12/2015 | Knippelmeyer | | B82Y 40/00 |
| 9,607,806 B2* | 3/2017 | Zonnevylle | | H01J 37/3177 |
| 2002/0000766 A1* | 1/2002 | Ono | | H01J 37/12 |
| | | | | 313/240 |
| 2002/0179855 A1* | 12/2002 | Muraki | | B82Y 40/00 |
| | | | | 250/492.22 |
| 2003/0085360 A1* | 5/2003 | Parker | | H01J 37/3174 |
| | | | | 250/396 R |
| 2004/0051053 A1* | 3/2004 | Barletta | | H01J 37/08 |
| | | | | 250/492.1 |
| 2005/0035300 A1* | 2/2005 | Iwasaki | | H01J 37/3174 |
| | | | | 250/396 R |
| 2006/0131698 A1* | 6/2006 | Jeong | | H01J 37/04 |
| | | | | 257/620 |
| 2010/0187434 A1* | 7/2010 | Platzgummer | | H01J 37/3026 |
| | | | | 250/396 R |
| 2012/0295202 A1* | 11/2012 | Sano | | B82Y 10/00 |
| | | | | 430/296 |
| 2014/0124684 A1* | 5/2014 | Matsumoto | | H01J 37/3177 |
| | | | | 250/492.3 |
| 2014/0158902 A1* | 6/2014 | Knippelmeyer | | H01J 37/10 |
| | | | | 250/396 R |
| 2014/0220494 A1* | 8/2014 | Yu | | H01J 37/00 |
| | | | | 430/325 |
| 2015/0255249 A1* | 9/2015 | Ogasawara | | H01J 37/045 |
| | | | | 250/396 R |
| 2015/0340195 A1* | 11/2015 | Brodie | | H01J 37/045 |
| | | | | 250/396 R |
| 2016/0268096 A1* | 9/2016 | Ren | | H01J 37/1472 |
| 2017/0178862 A1* | 6/2017 | Ogasawara | | H01J 37/153 |
| 2017/0345612 A1* | 11/2017 | Touya | | H01J 37/045 |
| 2018/0166248 A1* | 6/2018 | Ogasawara | | G03F 7/20 |

* cited by examiner

MULTIPLE ELECTRON BEAMS IRRADIATION APPARATUS

CROSS-REFERENCE TO RELATED APPLICATION

This application is based upon and claims the benefit of priority from prior Provisional Patent Application No. 62/785,014 filed on Dec. 26, 2018 in U.S.A., the entire contents of which are incorporated herein by reference.

BACKGROUND OF THE INVENTION

Field of the Invention

Embodiments of the present invention relate to a multiple electron beam irradiation apparatus. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between images, the comparison circuit compares the measured data with reference data according to an appropriate algorithm, and determines that there is a pattern defect if the compared data do not match with each other. Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with primary electron beams and detecting secondary electrons emitted from the inspection substrate by the irradiation with the primary electron beams. Regarding the inspection apparatus utilizing electron beams, an apparatus using multiple beams has also been under development. In a multiple beam irradiation apparatus, as the beam irradiating the surface of the target object comes away from the optical axis center to be toward the periphery, a difference arises in the beam spot diameter due to the effect of field curvature aberration. Therefore, if the field of view (FOV) is expanded, blurring of the beam increases under the influence of the aberration. Thus, there occurs a problem that it is difficult to expand the FOV in the apparatus for observing the surface of the target object, the inspection apparatus, etc. There is proposed to deflect a plurality of charged particle beams so as to correct chromatic aberration and spherical aberration by using an aberration corrector composed of a lens array, a quadrupole array, and a deflector array in which are disposed a plurality of deflectors having a function of a concave lens for deflecting the charged particle beams to be away from the optical axis (Japanese Patent Application Laid-open (JP-A) No. 2014-229481). However, if blurring is corrected for each beam, a power source is individually needed for each beam because an applied potential differs for each beam, thereby making the apparatus configuration extremely large.

BRIEF SUMMARY OF THE INVENTION

According to one aspect of the present invention, a multiple electron beam irradiation apparatus includes a forming mechanism that forms multiple primary electron beams; a plurality of electrode array substrates each that disposes thereon a plurality of electrodes each being arranged at a passage position of each of the multiple primary electron beams, the plurality of electrode array substrates being stacked, the each of the multiple primary electron beams being surrounded by an electrode of the plurality of electrodes in a case where the each of the multiple primary electron beams passes through the passage position; a first wiring and a second wiring that are applied with one of different electric potentials; and a stage that mounts thereon a target object to be irradiated with the multiple primary electron beams having passed through the plurality of electrode array substrates, wherein, in each of the plurality of electrode array substrates, each of the plurality of electrodes is electrically connected to either one of the first wiring and the second wiring.

DETAILED DESCRIPTION OF THE INVENTION

Embodiments below describe a multiple electron beam inspection apparatus as an example of a multiple electron beam irradiation apparatus.

The multiple electron beam irradiation apparatus is not limited to the inspection apparatus, and may be an apparatus irradiating multiple electron beams so as to acquire an image, for example.

First Embodiment

Figure 1:
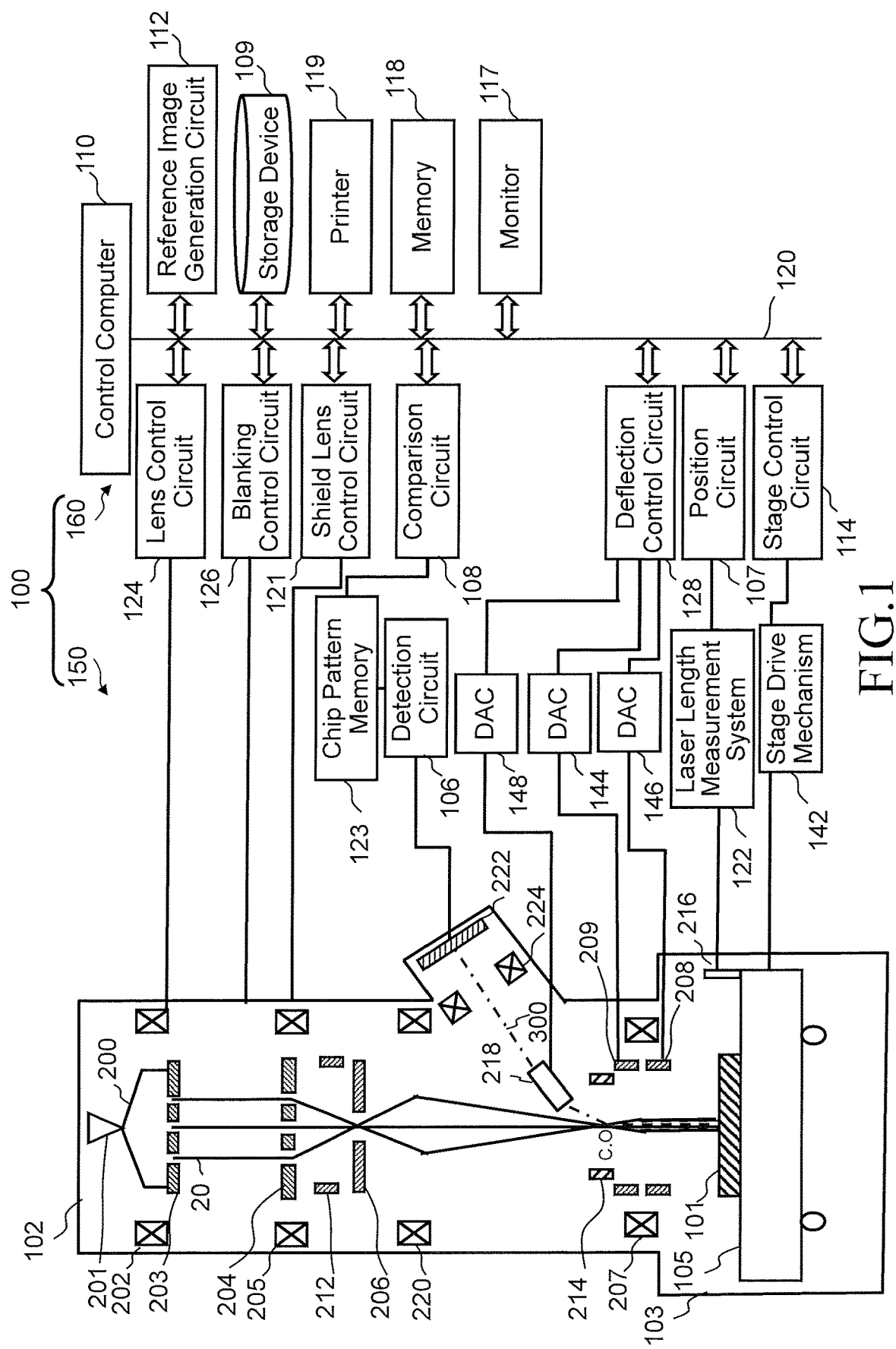
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, and a laser length measuring system 122. In the electron beam column 102, there are disposed an electron gun 201, an illumination lens 202, a shaping aperture array substrate 203 (an example of a forming mechanism), an electromagnetic lens 205, an aberration corrector 204, a common blanking deflector 212, a limiting aperture substrate 206, an electromagnetic lens 220, a beam separator 214, an objective lens 207, a main deflector 208, a sub deflector 209, a deflector 218, a projection lens 224, and a multi-detector 222. The primary electron beam optical system is composed of the illumination lens 202, the shaping aperture array substrate 203, the electromagnetic lens 205, the aberration corrector 204, the common blanking deflector 212, the limiting aperture substrate 206, the electromagnetic lens 220, the beam separator 214, the objective lens 207, the main deflector 208, and the sub deflector 209. The secondary electron beam optical system is composed of the beam separator 214, the deflector 218, and the projection lens 224.

An XY stage 105 movable at least in the x-y plane is disposed in the inspection chamber 103. A substrate 101 (target object) to be inspected is mounted on the XY stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the XY stage 105, for example. Moreover, on the XY stage 105, there is disposed a mirror 216 which reflects a laser beam for measuring a laser length emitted from the laser length measuring system 122 arranged outside the inspection chamber 103. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration correction circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144, 146, and 148. The DAC amplifier 146 is connected to the main deflector 208. The DAC amplifier 144 is connected to the sub deflector 209. The DAC amplifier 148 is connected to the deflector 218. The aberration correction circuit 121 is connected to the aberration corrector 204.

The chip pattern memory 123 is connected to the comparison circuit 108. The XY stage 105 is driven by the stage drive mechanism 142 under the control of the stage control circuit 114. With respect to the stage drive mechanism 142, for example, the drive system, such as a three (x-, y-, and θ-) axis motor which provides drive in the directions of x, y, and θ in the stage coordinate system, can move the XY stage 105. A step motor, for example, can be used as each of these x, y, and θ motors (not shown). The XY stage 105 is movable in the horizontal direction and the rotation direction by the X-, Y-, and θ-axis motors. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the x, y, and θ directions are set with respect to a plane orthogonal to the optical axis of the multiple primary electron beams, for example.

The common blanking deflector 212 is composed of at least two electrodes (or "at least two poles"), and controlled by the blanking control circuit 126. The main deflector 208 is composed of at least four electrodes (or "at least four poles"), and controlled by the deflection control circuit 128 through the DAC amplifier 146 disposed for each electrode. Similarly, the sub deflector 209 is composed of at least four electrodes (or "at least four poles"), and controlled by the deflection control circuit 128 through the DAC amplifier 144 disposed for each electrode. Similarly, the deflector 218 is composed of at least four electrodes (or "at least four poles"), and controlled by the deflection control circuit 128 through the DAC amplifier 148 disposed for each electrode.

FIG. 1 shows configuration elements necessary for describing the first embodiment. It should be understood that other configuration elements generally necessary for the inspection apparatus 100 may also be included therein.

Figure 2:
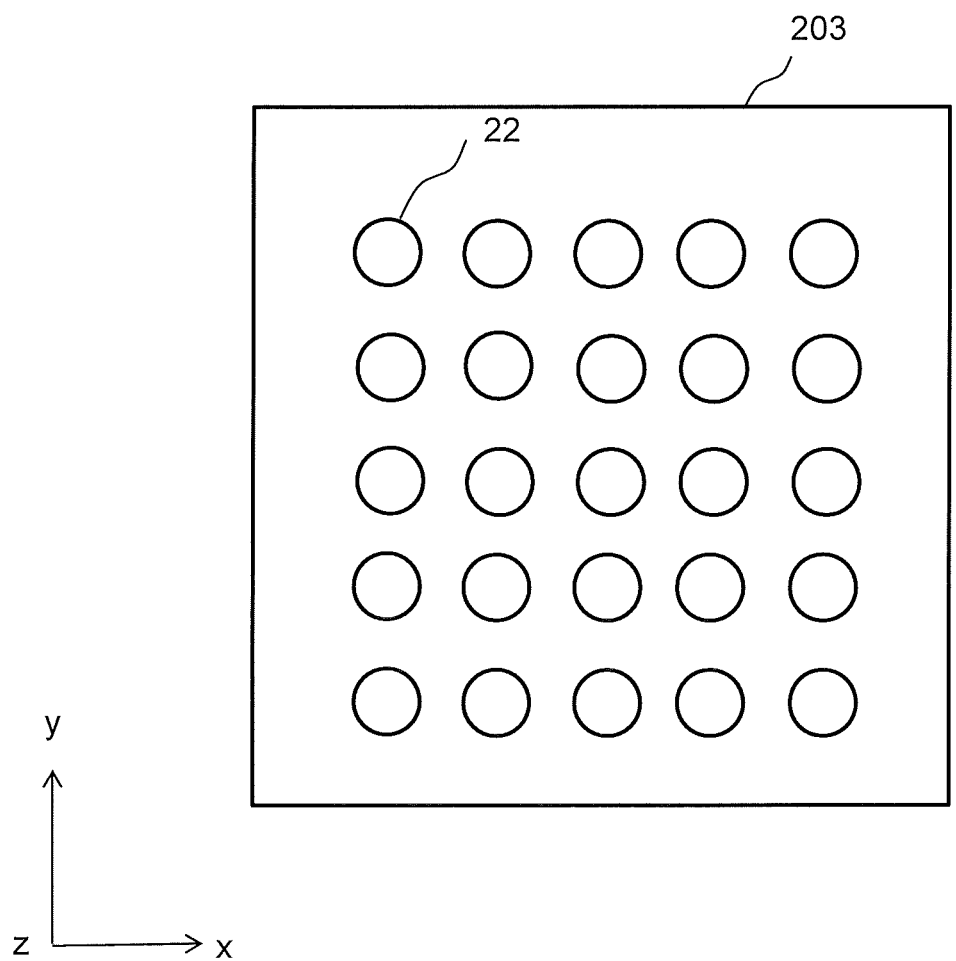
FIG. 2 is a conceptual diagram showing a structure of a shaping aperture array substrate according to the first embodiment.

FIG. 2 is a conceptual diagram showing a structure of a shaping aperture array substrate according to the first embodiment. As shown in FIG. 2, holes (openings) 22 of $m_1$ columns wide (width in the x direction) and $n_1$ rows long (length in the y direction) are two-dimensionally formed at a predetermined arrangement pitch in the shaping aperture array substrate 203, where $m_1$ and $n_1$ are integers of 2 or more. In the case of FIG. 2, holes (openings) 22 of 5×5, that is 5(columns of holes arrayed in the x direction)×5(rows of holes arrayed in the y direction), are formed. The arrangement number of the holes 22 is not limited thereto. Each of the holes 22 is a circle with the same outer diameter. Alternatively, each of the holes 22 may be a rectangle (including a square) having the same dimension, shape, and size. Multiple beams 20 are formed by letting portions of an electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where the holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1) th and the (k+2)th rows which are arrayed (accumulated) in the length direction (in the y direction) and each of which is in the x direction, each hole in the (k+1) th row and each hole in the (k+2)th row may be mutually displaced in the width direction (in the x direction) by a dimension "b".

Now, operations of the image acquisition mechanism 150 in the inspection apparatus 100 are described below.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of holes 22 (openings) are formed in the shaping aperture array substrate 203. The region including all the plurality of holes 22 is irradiated by the electron beam 200. For example, a plurality of electron beams (multiple primary electron beams) 20 (solid lines in FIG. 1) are formed by letting portions of the electron beam 200, which irradiate the positions of a plurality of holes 22, individually pass through a corresponding one of the plurality of holes 22 in the shaping aperture array substrate 203.

Each of the formed multiple primary electron beams 20 spreads after having converged individually at an image plane conjugate position (not shown), then the formed multiple primary electron beams 20 in the state where each beam is spreading are refracted toward the hole in the center of the limiting aperture substrate 206 by the electromagnetic lens 205. In other words, when receiving the incident multiple primary electron beams 20, the electromagnetic lens 205 refracts them. Here, the electromagnetic lens 205 refracts the multiple primary electron beams 20 such that the focus position of each beam is located at the position of the hole in the center of the limiting aperture substrate 206. At this stage, if all of the multiple primary electron beams 20 are collectively deflected by the common blanking deflector 212, they deviate from the hole in the center of the limiting aperture substrate 206 and are blocked by the limiting aperture substrate 206. On the other hand, the multiple primary electron beams 20 which were not deflected by the common blanking deflector 212 pass through the hole in the center of the limiting aperture substrate 206 as shown in FIG. 1. Blanking control of all the multiple primary electron beams 20 is collectively provided by ON/OFF of the common blanking deflector 212 to control ON/OFF of the multiple primary electron beams collectively. Thus, the limiting aperture substrate 206 blocks the multiple primary electron beams 20 which were deflected to be in the OFF condition by the common blanking deflector 212. Then, the multiple primary electron beams 20 for inspection are formed by the beams having been made during a period from becoming "beam ON" to becoming "beam OFF" and having passed through the limiting aperture substrate 206.

The multiple primary electron beams 20 having passed through the limiting aperture substrate 206 travel toward the electromagnetic lens 220. Receiving the incident multiple primary electron beams 20, the electromagnetic lens 220 refracts them. The multiple primary electron beams 20 form a crossover (C.O.) for each beam by the electromagnetic lens 220. After passing through the beam separator 214 disposed at the position of the crossover formed for each beam, the multiple primary electron beams 20 are focused on the substrate 101 (target object) by the objective lens 207 to be a pattern image (beam diameter) of a desired reduction ratio. Then, all the multiple primary electron beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple primary electron beams 20 to the reference position of the mask die to be scanned by the multiple primary electron beams 20. According to the first embodiment, scanning is performed while continuously moving the XY stage 105, for example. Therefore, the main deflector 208 performs tracking deflection to follow the movement of the XY stage 105. Then, the sub deflector 209 collectively deflects all of the multiple primary electron beams 20 so that each beam may scan a corresponding region. Ideally, the multiple primary electron beams 20 irradiating at a time are aligned at the pitch obtained by multiplying the arrangement pitch of a plurality of holes 22 in the shaping aperture array substrate 203 by a desired reduction ratio (1/a). Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple primary electron beams 20, is emitted from the substrate 101 because desired positions on the substrate 101 are irradiated with the multiple primary electron beams 20. In FIG. 1, a single beam is shown on behalf of the multiple secondary electron beams 300.

The multiple secondary electron beams 300 emitted from the substrate 101 are refracted toward their center by the objective lens 207, and travel toward the beam separator 214 disposed at the crossover position. The beam separator 214 separates the multiple secondary electron beams 300, which are emitted from the substrate 101 (target object) because its surface is irradiated with the multiple primary electron beams 20, from the multiple primary electron beams 20.

The beam separator 214 generates an electric field and a magnetic field to be orthogonal to each other in a plane perpendicular to the traveling direction (optical axis) of the center beam of the multiple primary electron beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20. In FIG. 1, a single beam is shown on behalf of the multiple secondary electron beams 300.

The multiple secondary electron beams 300 bent obliquely upward are further bent by the deflector 218 to travel to the projection lens 224. Then, the multiple secondary electron beams 300 deflected by the deflector 218 are projected onto the multi-detector 222 while being refracted by the projection lens 224. The multi-detector 222 individually detects the multiple secondary electron beams separated from the multiple primary electron beams 20. Specifically, the multi-detector 222 detects the projected multiple secondary electron beams 300. Tracking deflection is provided as described above since scanning is performed while continuously moving the XY stage 105. The deflector 218 cancels out (compensates for) deviation of the light receiving position of the multiple secondary electron beams 300 on the light receiving surface of the multi-detector 222, which is due to movement of the deflection positions of the multiple primary electron beams 20 along with the tracking deflection and the scanning operation, and deflects the multiple secondary electron beams 300 so that they may irradiate respective desired positions on the light receiving surface of the multi-detector 222. Then, the multi-detector 222 detects the multiple secondary electron beams 300. An image is formed on the substrate 101 by an intensity signal detected by the multi-detector 222.

Figure 3:
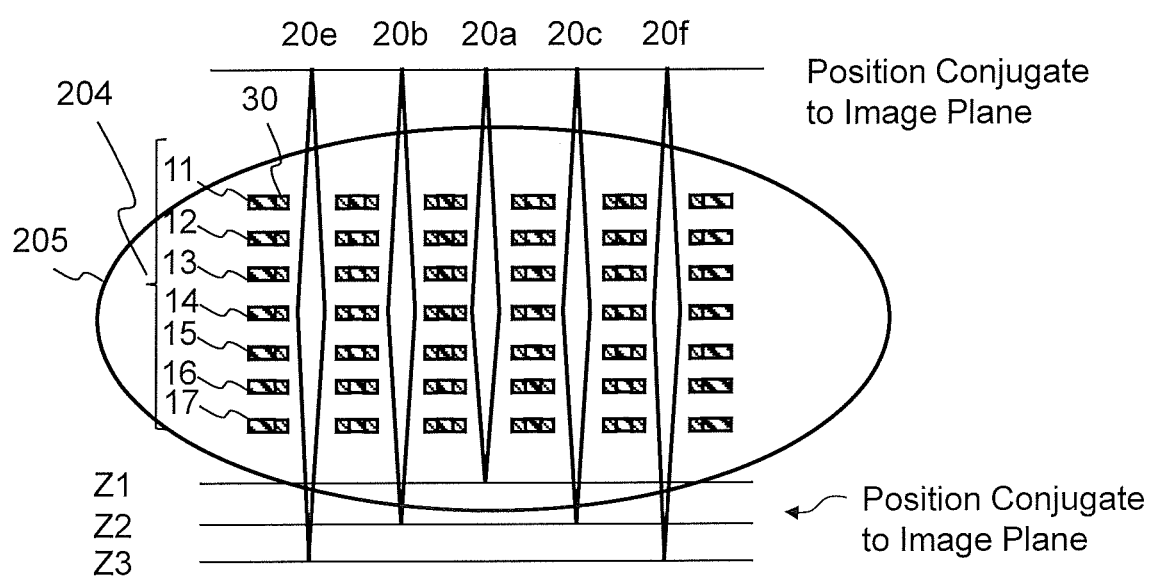
FIG. 3 shows a sectional view illustrating a structure of an aberration corrector according to the first embodiment.

FIG. 3 shows a sectional view illustrating a structure of an aberration corrector according to the first embodiment. In FIG. 3, the aberration corrector 204 is disposed in the magnetic field of the electromagnetic lens 205. The aberration corrector 204 includes a plurality of annular electrode array substrates 11, 12, 13, 14, 15, 16, and 17 (examples of a plurality of electrode array substrates). The plurality of annular electrode array substrates 11, 12, 13, 14, 15, 16, and 17 are stacked. In each of the annular electrode array substrates 11, 12, 13, 14, 15, 16, and 17, a passage hole is formed to be arranged at the passage position of each of the multiple primary electron beams 20, and an annular electrode 30 (an example of an electrode) is disposed at each passage hole. For example, the annular electrode 30 being a hollow cylinder (tube) with a circular section is disposed for each passage hole. In other words, in each of the annular electrode array substrates 11, 12, 13, 14, 15, 16, and 17, there are disposed a plurality of annular electrodes 30, each of the multiple primary electron beams 20 being surrounded by an annular electrode of the plurality of annular electrodes 30 in the case where each of the multiple primary electron beams 20 passes through the passage position. The annular electrode array substrates 11, 12, 13, 14, 15, 16, and 17 are arranged in a manner such that a predetermined space exists between adjacent annular electrode array substrates. The number of the annular electrode array substrates stacked is five or more. More preferably, it is seven or more. If the number of the annular electrode array substrates is five, it is possible to select one-stage or two-stage electrostatic lens for each beam, thereby selectively utilizing two kinds of converging or focusing actions. If the number of the annular electrode array substrates is seven, it is possible to select one-stage, two-stage, or three-stage electrostatic lens for each beam, thereby selectively utilizing three kinds of converging or focusing actions. According to the first embodiment, correction is performed by individually shifting (displacing) the image plane conjugate position (focus position) of each beam. For this reason, each of a plurality of annular electrode array substrates 11, 12, 13, 14, 15, 16, and 17 is disposed at a position different from the position conjugate to the image plane position of each beam of the multiple primary electron beams 20. In the case of FIG. 3, after converging at the image plane conjugate position, each beam of the multiple primary electron beams 20 formed by the shaping aperture array substrate 203 travels, while spreading, through the corresponding annular electrode 30 in a plurality of the annular electrode array substrates 11, 12, 13, 14, 15, 16, and 17. Then, in the process of beam travelling, changing the state to perform convergence, each beam of the multiple primary electron beams 20 converges at a convergence point (position conjugate to the image plane) after passing through a plurality of the annular electrode array substrates 11, 12, 13, 14, 15, 16, and 17. In that case, according to the first embodiment, the aberration corrector 204 shifts (displaces), for each beam, the position conjugate to the image plane of each beam after passage through a plurality of the annular electrode array substrates 11, 12, 13, 14, 15, 16, and 17. In the case of FIG. 3, correction is performed such that the position conjugate to the image plane of each beam after passing through the aberration corrector 204 is shifted (displaced) to any one of three image plane conjugate positions Z1, Z2, and Z3 with different height positions.

As a comparative example of the first embodiment, in the case of changing the position conjugate to the image plane by the aberration corrector 204 with respect to, for example, an electron beam (e) emitted at the acceleration voltage of −10 kV and moving at high speed, at outside the magnetic field of the electromagnetic lens 205, it is necessary to apply an electric potential as much as the acceleration voltage, such as about −10 kV, to a plurality of annular electrode array substrates 11, 12, 13, 14, 15, 16, and 17. On the other hand, according to the first embodiment, the aberration corrector 204 is disposed in the magnetic field of the electromagnetic lens 205. Thereby, if, for example, an electron beam (e) emitted at the acceleration voltage of −10 kV and moving at high speed enters the magnetic field of the electromagnetic lens 205, the electron transfer speed becomes slow due to the magnetic field. Therefore, in the case of changing the image plane conjugate position being a focus position of the intermediate image focused by the electromagnetic lens 205, since the trajectory of an electron beam is corrected by the aberration corrector 204 in the state where the electron transfer speed is slow, in other words, in the state where the electronic energy is small, it is possible to reduce the potential to be applied to a plurality of annular electrode array substrates 11, 12, 13, 14, 15, 16, and 17 to, for example, about −100 V, being 1/100 of the acceleration voltage of −10 kV, for example.

Figure 4:
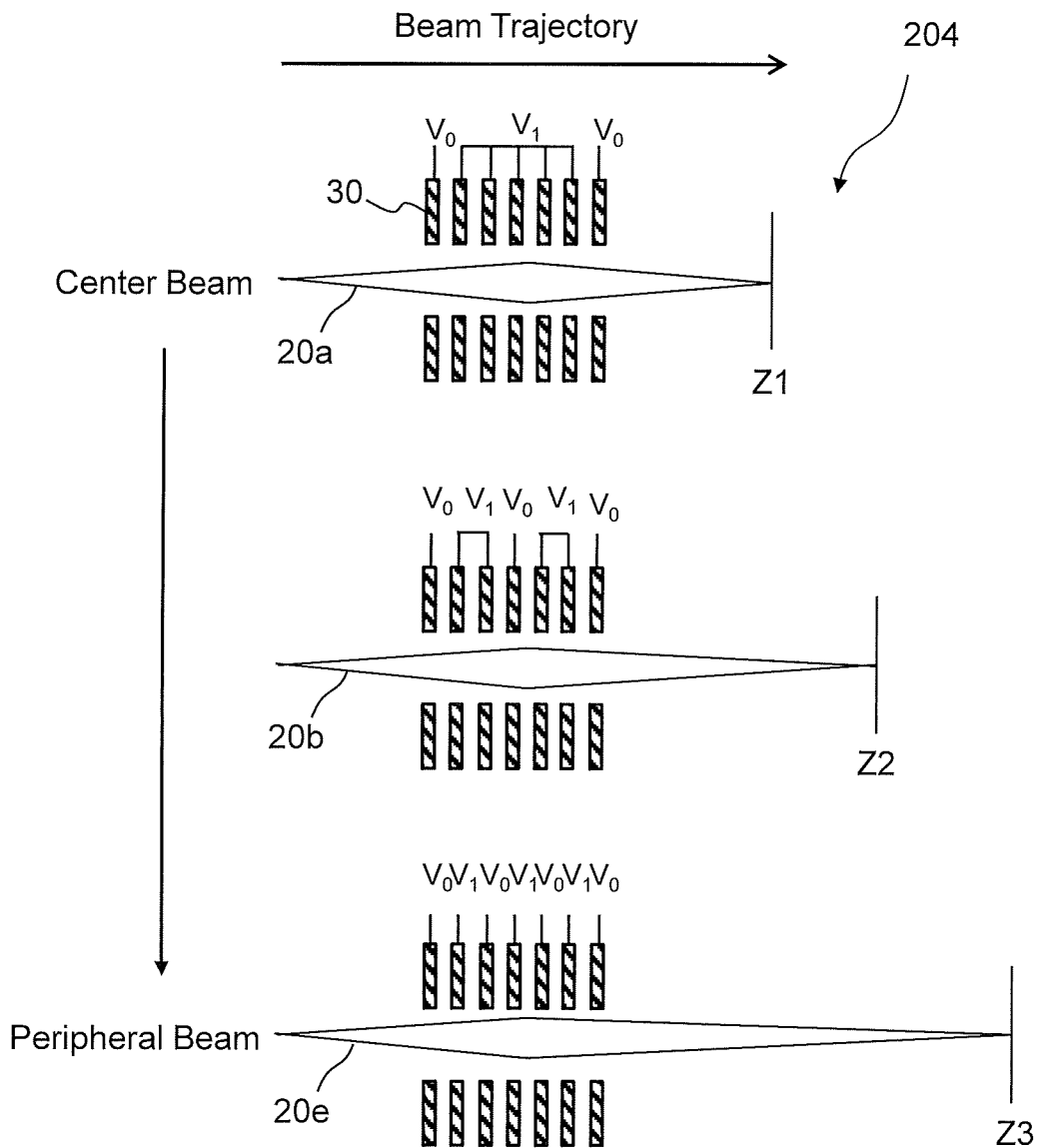
FIG. 4 illustrates a method for applying an electric potential to a plurality of annular electrode array substrates according to the first embodiment.

FIG. 4 illustrates a method for applying an electric potential to a plurality of annular electrode array substrates according to the first embodiment. When adjusting the focus position of the center beam (when focusing the center beam) of the multiple primary electron beams 20 onto the surface of the substrate 101, (that is, when setting the center beam as a reference), the more the beam is away from the center beam of the multiple primary electron beams 20, the more the beam's focus position is upward away from the surface of the substrate 101 due to the field curvature aberration. When adjusting the focus position of the peripheral beam (when focusing the peripheral beam) of the multiple primary electron beams 20 onto the surface of the substrate 101, (that is, when setting the peripheral beam as a reference), the focus position of the center beam of the multiple primary electron beams 20 becomes downward away from the surface of the substrate 101 due to the field curvature aberration. The peripheral beam is located on the inner peripheral side of the multiple primary electron beams 20, and the term "peripheral" is for representing contrast to the "center". Therefore, it is necessary to correct the trajectory such that the more the beam concerned is away from the center beam of the multiple primary electron beams 20, the more the image plane conjugate position after passage through the aberration corrector 204 is away from the aberration corrector 204. Then, according to the first embodiment, the lens action by the one-, two-, or three-stage electrostatic lenses) is selectively applied using two different electric potentials V0 and V1. Preferably, a ground potential (GND) is used as the potential V0. For example, a negative electric potential (negative control potential) of about −100 V is used as the electric potential V1. When using the ground potential GND and the negative control potential, with respect to the center beam and beams close to the center beam, the lens action by the one electrostatic lens is applied. With respect to beams at the peripheral side, the lens action by the three electrostatic lenses stacked is applied. With respect to beams at the middle, the lens action by the two electrostatic lenses stacked is applied. As shown in FIG. 4, in order to utilize the lens action by the one electrostatic lens, an electric potential V0 is applied to the first annular electrode 30 at the beam entrance side and the seventh annular electrode 30 at the beam exit side, and an electric potential V1 is applied to the remaining second to sixth annular electrodes 30 in the annular electrodes 30 of the seven annular electrode array substrates 11, 12, 13, 14, 15, 16, and 17. Thereby, the one-stage electrostatic lens using the two different electric potentials V0 and V1 can be configured. In order to utilize the lens action by the two electrostatic lenses stacked, an electric potential V0 is applied to the first annular electrode 30 at the beam entrance side, the fourth annular electrode 30, for example, at the middle, and the seventh annular electrode 30 at the beam exit side, and an electric potential V1 is applied to the remaining second, third, fifth, and sixth annular electrodes 30, in the annular electrodes 30 of the seven annular electrode array substrates 11, 12, 13, 14, 15, 16, and 17. Thus, the first stage electrostatic lens can be configured by the first to fourth annular electrodes 30, and the second stage electrostatic lens can be configured by the fourth to seventh annular electrodes 30. Accordingly, the two-stage electrostatic lens using the two different electric potentials V0 and V1 can be configured. In order to utilize the lens action by the three electrostatic lenses stacked, an electric potential V0 is applied to the first, third, fifth, and seventh annular electrodes 30 at the beam entrance side, and an electric potential V1 is applied to the remaining second, fourth, and sixth annular electrodes 30 in the annular electrodes 30 of the seven annular electrode array substrates 11, 12, 13, 14, 15, 16, and 17. Thereby, the first stage electrostatic lens can be configured by the first to third annular electrodes 30, the second stage electrostatic lens can be configured by the third to fifth annular electrodes 30, and the third stage electrostatic lens can be configured by the fifth to seventh annular electrodes 30. Accordingly, the three-stage electrostatic lens using the two different electric potentials V0 and V1 can be configured. Since the electric potential V1 is constant, the lens action applied each time is constant. Therefore, the more the times of applied electrostatic lens action is, the smaller the beam focusing action after passage of the aberration corrector 204 can be made. In other words, the position conjugate to the image plane after passage of the aberration corrector 204 can be made farther (further away).

Although not shown, when using the ground potential GND (V0) and the positive control potential (e.g., +100V) (V1), with respect to the center beam and beams close to the center beam, the lens action by the three electrostatic lenses stacked is applied. With respect to beams at the peripheral side, the lens action by the one electrostatic lens is applied. With respect to beams at the middle, the lens action by the two electrostatic lenses stacked is applied. In that case, the more the times of applied electrostatic lens action is, the more the beam focusing action after passage of the aberration corrector 204 can be made. In other words, the closer to the center the beam is, the closer the position conjugate to the image plane after passage of the aberration corrector 204 can be made.

Figure 5:
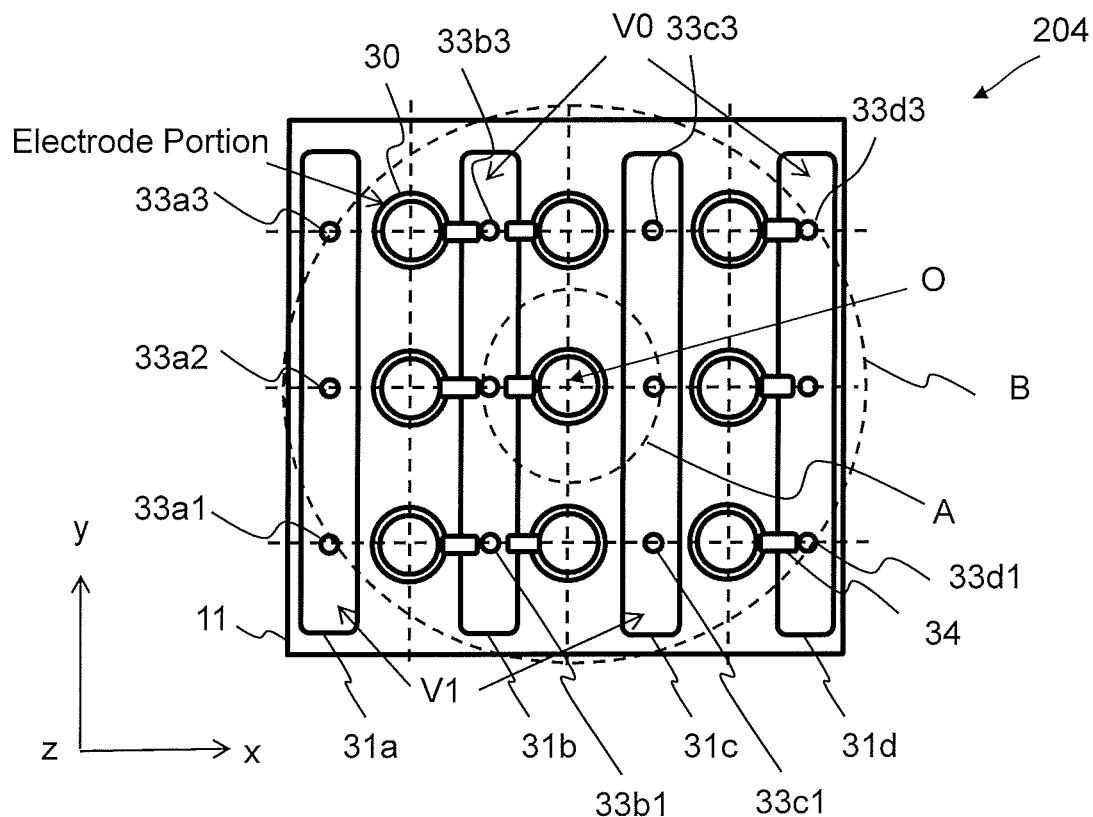
FIG. 5 is a top view showing an example of a structure of an aberration corrector according to the first embodiment.
Figure 6:
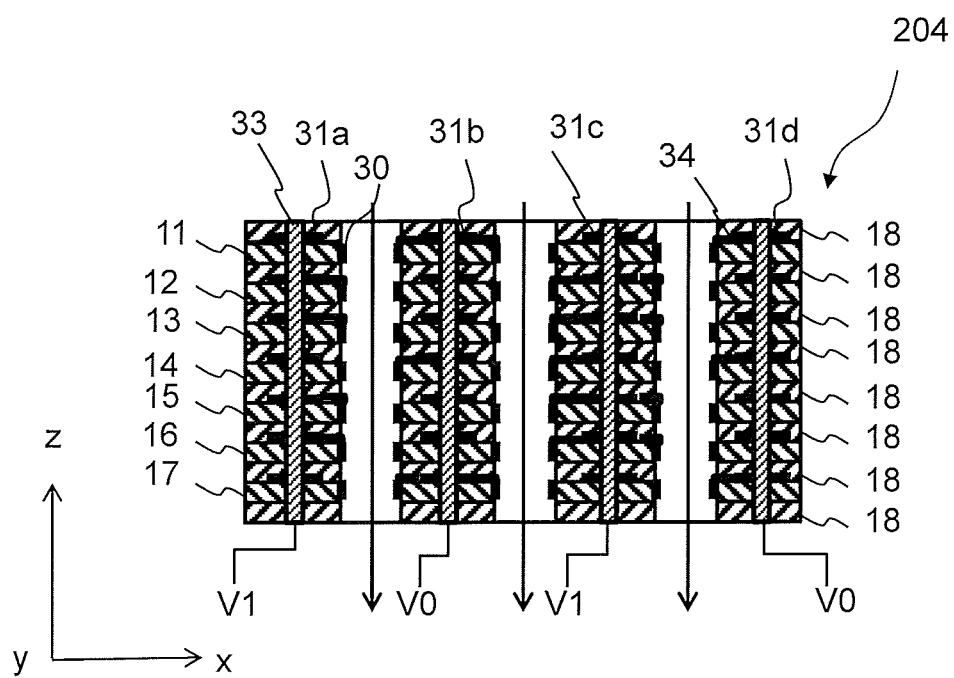
FIG. 6 is a sectional view showing an example of a structure of an aberration corrector according to the first embodiment.

FIG. 5 is a top view showing an example of a structure of an aberration corrector according to the first embodiment. FIG. 6 is a sectional view showing an example of a structure of an aberration corrector according to the first embodiment. The case of FIG. 5 shows the upper surface portion of the first annular electrode array substrate 11. Each of the annular electrode array substrates 11, 12, 13, 14, 15, 16, and 17 is formed using a silicon substrate, for example, employing MEMS technology, for example. In each of the annular electrode array substrates 11, 12, 13, 14, 15, 16 and 17, a plurality of passage holes through which the multiple primary electron beams 20 pass are formed. Then, after the whole exposed surface of the silicon substrate is covered with an insulating film, the annular electrode 30 using conductive material is disposed at the inner wall surface of each passage hole. Each annular electrode 30 is formed using conductive material, such as metal. The example of FIGS. 5 and 6 shows the case where the multiple primary electron beams 20 of 3×3 pass. Therefore, on each of the annular electrode array substrates 11, 12, 13, 14, 15, 16, and 17, the annular electrodes 30 of 3×3 in the x and y directions are arranged.

A conductive layer 31 (31a to 31d) common to one column is arranged at the space between the annular electrodes 30 on each of the annular electrode array substrates 11, 12, 13, 14, 15, 16, and 17, and at the peripheries which are in the x direction to each other. Each conductive layer 31 is formed using conductive material, such as metal, to be a plate-like layer extending in the y direction, for example. The electric potential V1 and the electric potential V0 are alternately applied in the x direction to each conductive layer 31. In the case of FIGS. 5 and 6, for example, a conductive layer 31a which is common to one column and to which the electric potential V1 is applied is disposed at the −x direction side of the annular electrodes 30 in the first column of the columns arrayed in the x direction. A conductive layer 31b which is common to one column and to which the electric potential V0 is applied is disposed at the −x direction side of the annular electrodes 30 in the second column of the columns arrayed in the x direction. A conductive layer 31c which is common to one column and to which the electric potential V1 is applied is disposed at the −x direction side of the annular electrodes 30 in the third column of the columns arrayed in the x direction. A conductive layer 31d which is common to one column and to which the electric potential V0 is applied is disposed at the +x direction side of the annular electrodes 30 in the third column of the columns arrayed in the x direction.

A plurality of annular electrode array substrates 11, 12, 13, 14, 15, 16, and 17 are connected such that an insulating layer 18 made of insulating material is disposed between adjacent annular electrode array substrates. Moreover, the insulating layer 18 is disposed on the front surface side of the first annular electrode array substrate 11, and another insulating layer 18 is disposed on the back surface side of the seventh annular electrode array substrate 17. Thereby, the conductive layer 31 and the annular electrode 30 are prevented from being exposed.

In the aberration corrector 204, there is provided a plurality of through-wirings 33 (an example of wiring) which penetrate through the annular electrode array substrates 11, 12, 13, 14, 15, 16, and 17. Each through-wiring 33 applies an electric potential common to the conductive layers 31 each arranged at the same position in each annular electrode array substrate. In the case of FIGS. 5 and 6, for example, three through-wirings 33 (33a1 to 33a3) (example of the first penetrating wiring) arranged in the y direction are connected to the conductive layer 31a of the first column of the columns arrayed in the x direction formed on each of the annular electrode array substrates 11, 12, 13, 14, 15, 16, and 17. Similarly, three through-wirings 33 (33b1 to 33b3) (an example of the second penetrating wiring, another example of the first penetrating wiring) arranged in the y direction are connected to the conductive layer 31b of the second column of the columns arrayed in the x direction. Three through-wirings 33 (33c1 to 33c3) (another example of the second penetrating wiring, another example of the first penetrating wiring) arranged in the y direction are connected to the conductive layer 31c of the third column of the columns arrayed in the x direction. Three through-wirings 33 (33d1 to 33d3) (another example of the second penetrating wiring) arranged in the y direction are connected to the conductive layer 31d of the fourth column of the columns arrayed in the x direction. For example, the through-wirings 33 adjacent to each other in the x direction are applied with different electric potentials. In the case of FIGS. 5 and 6, the aberration correction circuit 121 applies the electric potential V1 to the three through-wirings 33 (33a1 to 33a3) arranged in the y direction which are connected to the conductive layer 31a in the first column of the columns arrayed in the x direction. Thereby, the electric potential V1 is applied to the conductive layer 31a. The aberration correction circuit 121 applies the electric potential V0 to the three through-wirings 33 (33b1 to 33b3) arranged in the y direction which are connected to the conductive layer 31b in the second column of the columns arrayed in the x direction. Thereby, the electric potential V0 is applied to the conductive layer 31b. The aberration correction circuit 121 applies the electric potential V1 to the three through-wirings 33 (33c1 to 33c3) arranged in the y direction which are connected to the conductive layer 31c in the third column of the columns arrayed in the x direction. Thereby, the electric potential V1 is applied to the conductive layer 31c. The aberration correction circuit 121 applies the electric potential V0 to the three through-wirings 33 (33d1 to 33d3) arranged in the y direction which are connected to the conductive layer 31d in the fourth column of the columns arrayed in the x direction. Thereby, the electric potential V0 is applied to the conductive layer 31d.

In each of the annular electrode array substrates 11, 12, 13, 14, 15, 16, and 17, a plurality of annular electrodes 30 are individually electrically connected to either the through-wiring 33 applied with the electric potential V1 or the through-wiring 33 applied with the electric potential V0. Specifically, since each annular electrode 30 is located between the conductive layer 31 to which the electric potential V1 has been applied by the through-wiring 33 applied with the electric potential V1, and the conductive layer 31 to which the electric potential V0 has been applied by the through-wiring 33 applied with the electric potential V0, a wiring 34 is formed in a manner such that it may be selectively connected to the conductive layer 31.

As described with reference to FIG. 4, when using the ground potential GND (V0) and the negative control potential (V1), with respect to the center beam and beams close to the center beam, the lens action by the one electrostatic lens is applied. With respect to beams at the peripheral side, the lens action by the three electrostatic lenses stacked is applied. With respect to beams at the middle, the lens action by the two electrostatic lenses stacked is applied. Then, in each of the annular electrode array substrates 11, 12, 13, 14, 15, 16, and 17, each of a plurality of annular electrodes 30 is electrically connected to either selected one of the through-wiring 33 applied with the electric potential V1 and the through-wiring 33 applied with the electric potential V0 by selecting one of the through-wiring 33 with V1 and the through-wiring 33 with V0 in which the beam focusing action becomes smaller in proportion to being further away from the trajectory central axis O of the whole of the multiple primary electron beams 20. Then, in each of the annular electrode array substrates 11, 12, 13, 14, 15, 16, and 17, each of a plurality of annular electrodes 30 is connected to either one of the through-wiring 33 applied with the electric potential V1 and the through-wiring 33 applied with the electric potential V0 such that a plurality of annular electrodes 30 is rotational symmetry with respect to the trajectory central axis O of the multiple primary electron beams 20. For example, when using m×n multiple primary electron beams 20, the beams are divided into groups of concentric circles, for example three groups, centering on the trajectory central axis O of the multiple primary electron beams 20. Then, the through-wiring 33 with the electric potential for applying the lens action by the one electrostatic lens is electrically connected to each annular electrode 30 of each of the substrates through which each beam in the central side group passes. The through-wiring 33 with the electric potential for applying the lens action by the two electrostatic lenses stacked is electrically connected to each annular electrode 30 of each of the substrates through which each beam in the middle group passes. The through-wiring 33 with the electric potential for applying the lens action by the three electrostatic lenses stacked is electrically connected to each annular electrode 30 of each of the substrates through which each beam in the peripheral side group passes.

In the case of FIGS. 5 and 6, the through-wiring 33 with the electric potential for applying the lens action by the one electrostatic lens is electrically connected to each annular electrode 30 in the smallest concentric circle A centering on the trajectory central axis O of the whole of the multiple primary electron beams 20. Therefore, with respect to each annular electrode 30 in the first substrate, the through-wiring 33 with the electric potential V0 is electrically connected via the wiring 34 and the conductive layer 31. With respect to each annular electrode 30 in the second to sixth substrates, the through-wiring 33 with the electric potential V1 is electrically connected via the wiring 34 and the conductive layer 31. With respect to each annular electrode 30 in the seventh substrate, the through-wiring 33 with the electric potential V0 is electrically connected via the wiring 34 and the conductive layer 31. The through-wiring 33 with the electric potential for applying the lens action by the two electrostatic lenses stacked is electrically connected to each annular electrode 30 in the middle sized concentric circle B, excluding the concentric circle A, centering on the trajectory central axis O of the whole of the multiple primary electron beams 20. Therefore, with respect to each annular electrode 30 in the first, fourth, and seventh substrates, the through-wiring 33 with the electric potential V0 is electrically connected via the wiring 34 and the conductive layer 31. With respect to each annular electrode 30 in the second, third, fifth, and sixth substrates, the through-wiring 33 with the electric potential V1 is electrically connected via the wiring 34 and the conductive layer 31. Although the case of 3×3 annular electrodes 30 is shown in FIGS. 5 and 6, if the number of beams of the multiple primary electron beams 20 is more, the number of concentric circle groups increases. For example, if there is the annular electrode 30 outside the concentric circle B, the through-wiring 33 with the electric potential for applying the lens action by the three electrostatic lenses stacked, for example, is electrically connected to this annular electrode 30 outside the concentric circle B. Therefore, with respect to each annular electrode 30 in the first, third, fifth, and seventh substrates, the through-wiring 33 with the electric potential V0 is electrically connected via the wiring 34 and the conductive layer 31. With respect to each annular electrode 30 in the second, fourth, and sixth substrates, the through-wiring 33 with the electric potential V1 is electrically connected via the wiring 34 and the conductive layer 31.

When using the ground potential GND (V0) and the positive control potential (V1), the number of electrostatic lenses to apply the lens action should be reversed to the case using the ground potential GND (V0) and the negative control potential (V1).

Figure 7:
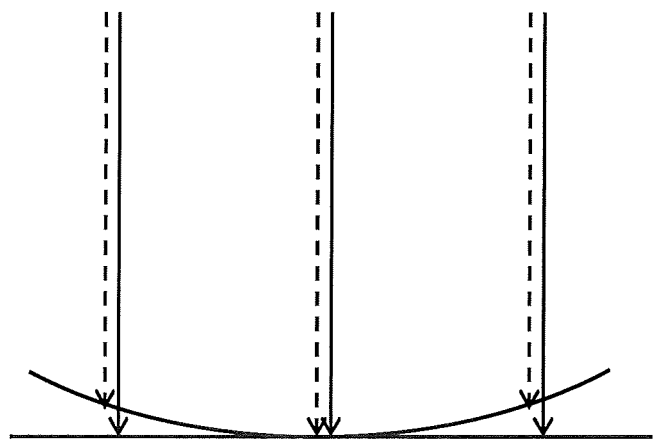
FIG. 7 illustrates an effect of an aberration corrector according to the first embodiment.

FIG. 7 illustrates an effect of an aberration corrector according to the first embodiment. With respect to the multiple primary electron beams 20 with field curvature, by individually correcting, by the aberration corrector 204, the position conjugate to the image plane of after passage of the aberration corrector 204, as shown in FIG. 7, the focus position of each beam can be focused on the same plane such as the surface of the substrate 101.

Figure 8:
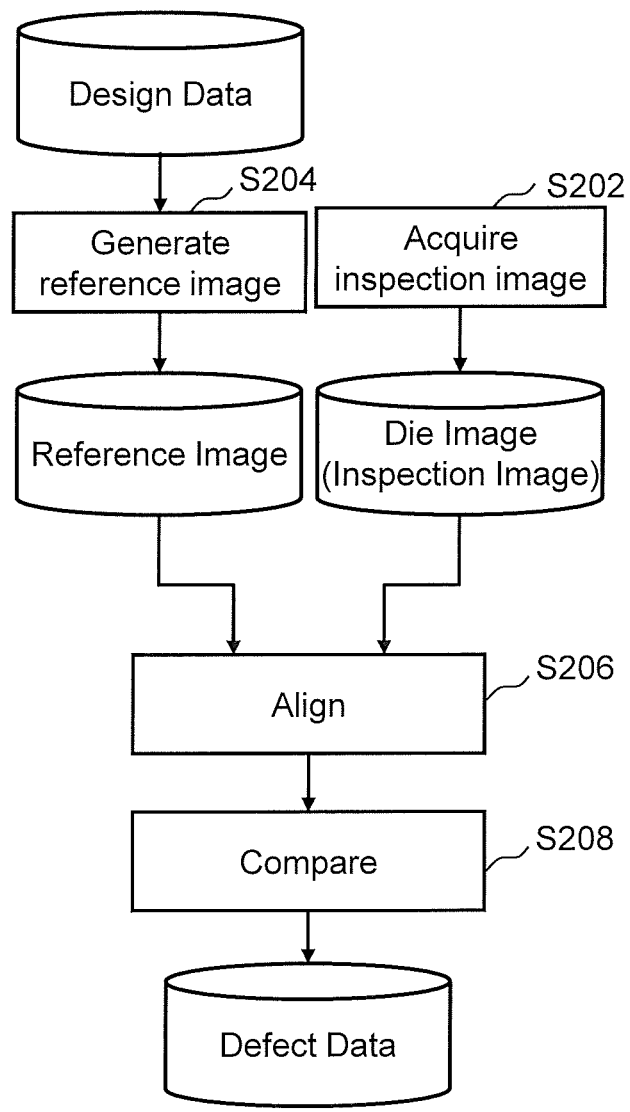
FIG. 8 is a flowchart showing main steps of an inspection method according to the first embodiment.

FIG. 8 is a flowchart showing main steps of an inspection method according to the first embodiment. In FIG. 8, the inspection method of the first embodiment executes a series of steps: an inspection image acquisition step (S202), a reference image generating step (S204), an alignment step (S206), and a comparison step (S208).

In the inspection image acquisition step (S202), the image acquisition mechanism 150 acquires a secondary electron image of a pattern formed on the substrate 101 (target object), by using the multiple primary electron beams 20 having passed the aberration corrector 204. Specifically, it operates as follows: As described above, the multiple primary electron beams 20 formed by the shaping aperture array substrate 203 enters the electromagnetic lens 205.

While passing through the magnetic field of the electromagnetic lens 205, the beam trajectory of each of the multiple primary electron beams 20 is individually corrected by passing through the annular electrode array substrates 11, 12, 13, 14, 15, 16, and 17 of the aberration corrector 204. Then, the multiple primary electron beams 20 having passed through the annular electrode array substrates 11, 12, 13, 14, 15, 16, and 17 pass through the common blanking deflector 212, the limiting aperture substrate 206, the electromagnetic lens 220, and the beam separator 214. Then, the multiple primary electron beams 20 are focused on the surface of the substrate 101 by the objective lens 207. The substrate 101 to be irradiated with the multiple primary electron beams 20 is placed on the XY stage 105. The multiple secondary electron beams 300 emitted from the substrate 101 pass through the objective lens 207, the beam separator 214, the deflector 218, and the projection lens 224 so as to individually detect each secondary electron beam by the multi-detector 222.

Figure 9:
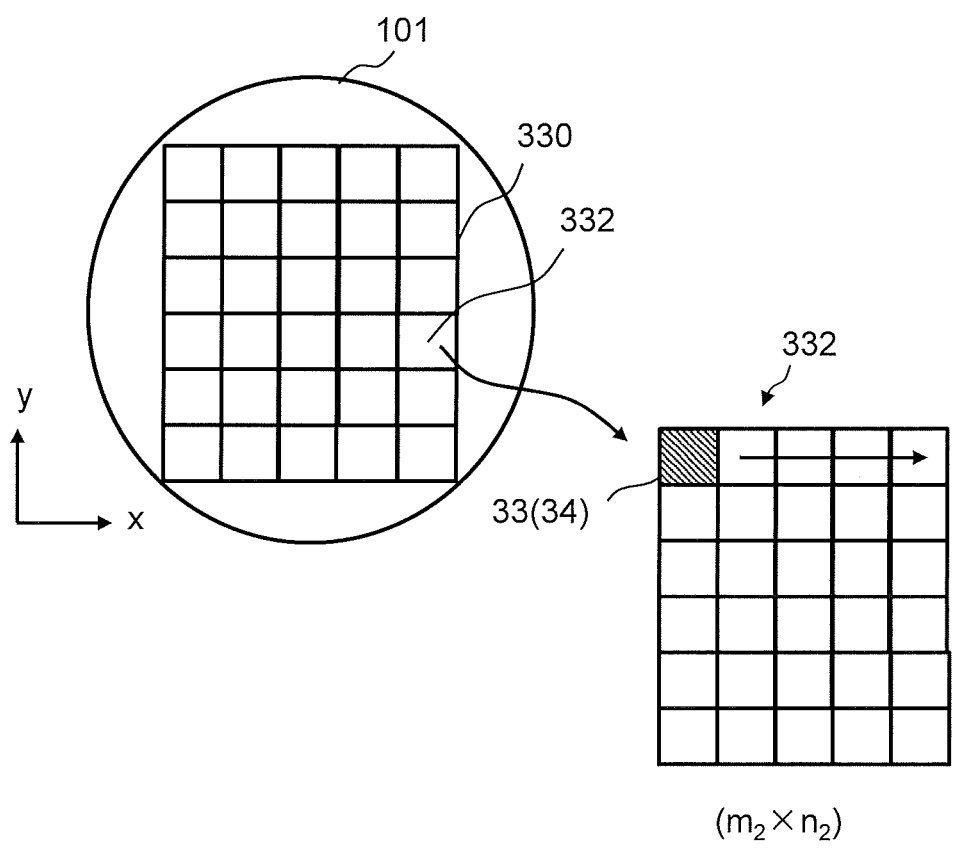
FIG. 9 shows an example of a plurality of chip regions formed on a semiconductor substrate, according to the first embodiment.

FIG. 9 shows an example of a plurality of chip regions formed on a semiconductor substrate, according to the first embodiment. In FIG. 9, in the case of the substrate 101 being a semiconductor substrate (wafer), a plurality of chips (wafer dies) 332 in a two-dimensional array are formed in an inspection region 330 of the semiconductor substrate (wafer die). A mask pattern for one chip formed on an exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or more), for example. In the first embodiment, a mask die 33 serves as a unit inspection region.

Figure 10:
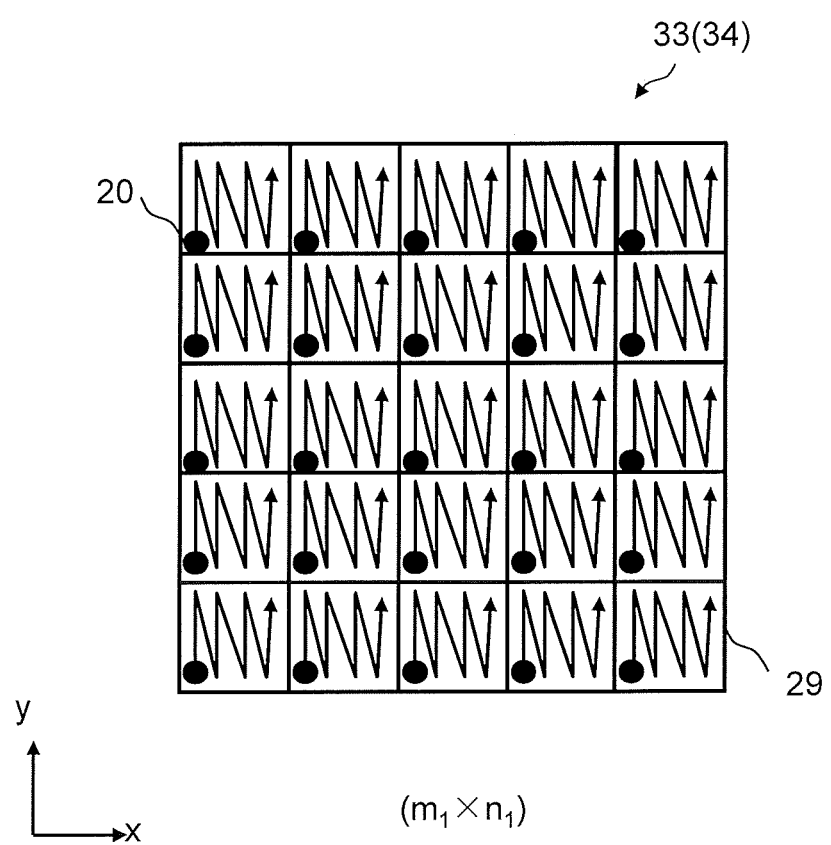
FIG. 10 illustrates a scanning operation with multiple beams according to the first embodiment.

FIG. 10 illustrates a scanning operation with multiple beams according to the first embodiment. FIG. 10 shows the case of multiple primary electron beams 20 of 5×5 (rows by columns). The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). In the case of FIG. 10, the irradiation region 34 and the mask die 33 are of the same size. However, it is not limited thereto. The irradiation region 34 may be smaller than the mask die 33, or larger than it. Each beam of the multiple primary electron beams 20 scans the inside of a sub-irradiation region 29 surrounded by the pitch between beams in the x direction and the pitch between beams in the y direction, where the beam concerned itself is located. Each beam of the multiple primary electron beams 20 is associated with any one of the sub-irradiation regions 29 which are different from each other. At the time of each shot, each beam irradiates the same position in the associated sub-irradiation region 29. The beam is moved in the sub-irradiation region 29 by collectively deflecting all the multiple primary electron beams 20 by the sub deflector 209. By repeating this operation, one beam irradiates all the pixels in order in one sub-irradiation region 29.

As described above, the whole of the multiple primary electron beams 20 scans the mask die 33 as the irradiation region. 34, and that is, each beam individually scans one corresponding sub-irradiation region 29. After scanning one mask die 33, the irradiation region 34 is moved to a next adjacent mask die 33 so as to be scanned. This operation is repeated to proceed scanning of each chip 332. Due to shots of the multiple primary electron beams 20, secondary electrons are emitted from the irradiated positions at each shot time, and detected by the multi-detector 222.

By performing scanning with the multiple primary electron beams 20 as described above, the scanning operation (measurement) can be performed at a higher speed than scanning with a single beam. The scanning of each mask die 33 may be performed by the "step and repeat" operation, or performed by continuously moving the XY stage 105. When the irradiation region 34 is smaller than the mask die 33, the scanning operation can be performed while moving the irradiation region 34 in the mask die 33 concerned.

In the case of the substrate 101 being an exposure mask substrate, the chip region for one chip formed on the exposure mask substrate is divided into a plurality of stripe regions in a strip form by the size of the mask die 33 described above, for example. Then, each mask die 33 is scanned through the same scanning operation described above for each stripe region. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning distance for scanning the chip region for one chip is, for example, four times the distance for scanning the chip region of one chip of the mask die 33 of the semiconductor substrate. However, since a pattern for one chip is formed on the exposure mask substrate, the scanning distance can be less compared to the case of the semiconductor substrate on which more than four chips are formed.

In the meantime, detected data (measured image: secondary electron image: image to be inspected) on a secondary electron from each position detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information data on each position from the position circuit 107.

In the reference image generating step (S204), the reference image generation circuit 112 (reference image generation unit) generates a reference image corresponding to an inspection image to be inspected. The reference image generation circuit 112 generates the reference image for each frame region, based on design data serving as a basis for forming a pattern on the substrate 101, or on design pattern data defined in exposure image data of a pattern formed on the substrate 101. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x,y) of the reference position of the figure, lengths of sides of the figure, and a figure code serving as an identifier for identifying the figure type such as rectangles, triangles and the like.

When design pattern data serving as the figure data is input to the reference image generation circuit 112, the data is developed into data of each figure. Then, the figure code indicating the figure shape, the figure dimensions, and the like of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8(=1/256)$, the occupancy rate in each pixel is calculated by allocating small regions which correspond to the region of figures arranged in the pixel concerned and each of which corresponds to 1/256 resolution. Then, 8-bit occupancy rate data is output to the reference image generation circuit 112. The square region (inspection pixel) should be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in an analog state continuously changing, it is possible to match/fit the design image data with the measured data by also applying a filtering process to the design image data being image data on the design side whose image intensity (gray scale level) is represented by digital values. The generated image data of a reference image is output to the comparison circuit 108.

Figure 11:
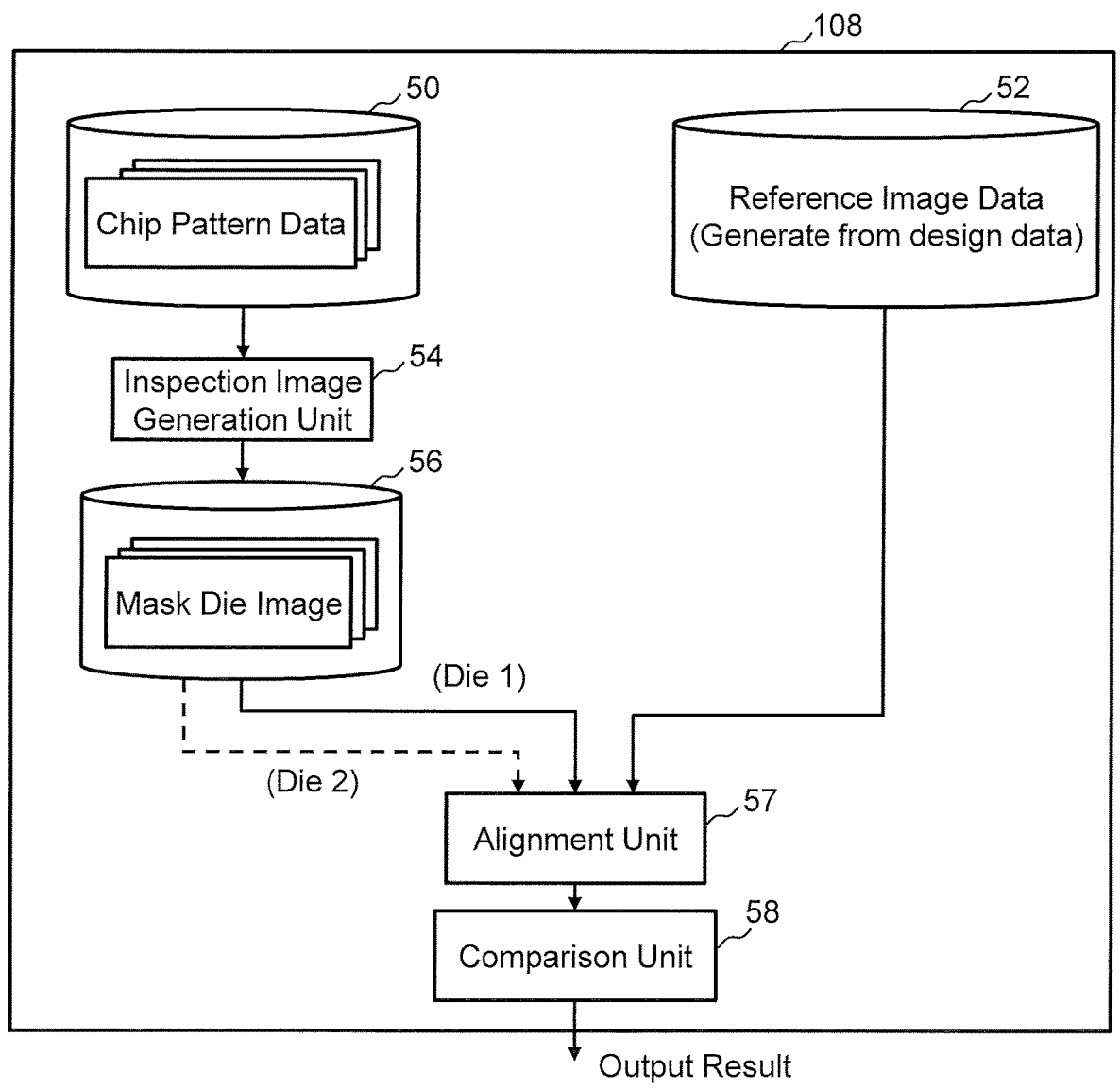
FIG. 11 shows an example of an internal configuration of a comparison circuit according to the first embodiment.

FIG. 11 shows an example of an internal configuration of a comparison circuit according to the first embodiment. In FIG. 11, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the inspection image generation unit 54, the alignment unit 57, and the comparison unit 58, and calculated results are stored in a memory (not shown) or in the memory 118 each time.

In the comparison circuit 108, transmitted stripe pattern data (or chip pattern data) is temporarily stored in the storage device 50, together with information indicating each position from the position circuit 107. Moreover, transmitted reference image data is temporarily stored in the storage device 52.

Next, using stripe pattern data (or chip pattern data), the inspection image generation unit 54 generates a frame image (inspection image, that is, image to be inspected) for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads a mask die image serving as an inspection image, and a reference image corresponding to the mask die image, and provides alignment/positioning between the images based on units of sub-pixels smaller than pixels. For example, the alignment can be performed by a least-square method.

In the comparison step (S208), the comparison unit 58 compares the mask die image (inspection image) and the reference image concerned. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output, and specifically, output to the storage device 109, the monitor 117, or the memory 118, or alternatively, output from the printer 119.

Although the die-to-database inspection is described above, the die-to-die inspection may also be performed. In the case of conducting the die-to-die inspection, images of the mask dies 33 with the same patterns formed thereon are compared. Accordingly, an image of the mask die 33 of a partial region of the chip 332 serving as a die (1), and an image of the mask die 33 of a corresponding region of another chip 332 serving as a die (2) are used. Alternatively, an image of the mask die 33 of a partial region of the chip 332 serving as a die (1), and an image of the mask die 33 of another partial region of the same chip 332 serving as a die (2), where the same patterns are formed, may be compared. In such a case, if one of the images of the mask dies 33 on which the same patterns are formed is used as a reference image, inspection can be performed by the same method as that of the die-to-database inspection described above.

That is, in the alignment step (S206), the alignment unit 57 reads the image of the mask die 33 of the die (1) and the image of the mask die 33 of the die (2), and provides alignment between the images, based on units of sub-pixels smaller than units of pixels. For example, the alignment cam be performed using a least-square method.

Then, in the comparison step (S208), the comparison unit 58 compares the image of the mask die 33 of the die (1) and the image of the mask die 33 of the die (2). The comparison unit 58 compares them, for each pixel, based on predetermined determination conditions in order to determine whether there is a defect such as a shape defect. For example, if a gray scale level difference of each pixel is larger than the determination threshold Th, it is determined that there is a defect. Then, the comparison result is output, and specifically, output to the storage device 109, the monitor 117, or the memory 118, or alternatively, output from the printer 119.

As described above, according to the first embodiment, the field curvature of the multiple primary electron beams 20 can be corrected by selectively using the two electric potentials V1 and V0. Therefore, a difference in the beam spot diameter due to the influence of field curvature aberration can be suppressed. Thus, the field of view (FOV) can be expanded in review and/or inspection of surface observation and the like of the substrate 101. Furthermore, since the number of power sources can be suppressed, large-scale configuration of the apparatus can be avoided.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the aberration correction circuit 121, the deflection control circuit 128, etc. may be configured by at least one processing circuit described above.

Embodiments have been explained referring to specific examples described above. However, the present invention is not limited to these specific examples. Although, in the examples described above, annular electrodes are disposed at all the beam passage positions, it is also preferable to configure a plural-stage electrostatic lens by disposing no electrode at the passage positions of the central beam and disposing annular electrodes at the passage position of the outer side beam (or vice versa).

While the apparatus configuration, control method, and the like not directly necessary for explaining the present invention are not described, some or all of them can be appropriately selected and used on a case-by-case basis when needed.

In addition, any other multiple electron beam irradiation apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam irradiation apparatus comprising:
    a forming mechanism that forms multiple primary electron beams;
    a plurality of electrode array substrates each that disposes thereon a plurality of electrodes each being arranged at a passage position of each of the multiple primary electron beams, the plurality of electrode array substrates being stacked, the each of the multiple primary electron beams being surrounded by an electrode of the plurality of electrodes in a case where the each of the multiple primary electron beams passes through the passage position;
    a first wiring and a second wiring that are applied with one of different electric potentials; and
    a stage that mounts thereon a target object to be irradiated with the multiple primary electron beams having passed through the plurality of electrode array substrates,
    wherein, in each of the plurality of electrode array substrates, each of the plurality of electrodes is electrically connected to either one of the first wiring and the second wiring, and at least one of the plurality of electrode array substrates has both of an electrode electrically connected to the first wiring and an electrode electrically connected to the second wiring.

2. The apparatus according to claim 1, wherein, in the each of the electrode array substrates, the each of the plurality of electrodes is connected to either one of the first wiring and the second wiring such that the plurality of electrodes is rotational symmetry with respect to a trajectory central axis of a whole of the multiple primary electron beams.

3. The apparatus according to claim 1, wherein, in the each of the electrode array substrates, the each of the plurality of electrodes is connected to either selected one of the first wiring and the second wiring by selecting one of the first wiring and the second wiring in which a beam focusing action becomes smaller in proportion to being further away from a trajectory central axis of a whole of the multiple primary electron beams.

4. The apparatus according to claim 1, wherein the each of the plurality of electrode array substrates is disposed at a position different from a position conjugate to an image plane position of the each of the multiple primary electron beams.

5. The apparatus according to claim 1 further comprising:
an objective lens that focuses the multiple primary electron beams having passed through the plurality of electrode array substrates onto a surface of the target object.

6. The apparatus according to claim 1 further comprising:
a beam separator that separates multiple secondary electron beams emitted because the target object is irradiated with the multiple primary electron beams from the multiple primary electron beams; and
a multi-detector that individually detects the multiple secondary electron beams having been separated.

7. The apparatus according to claim 1, wherein the first wiring and the second wiring are disposed such that they penetrate through the plurality of electrode array substrates.

* * * * *